United States Patent [19]
Levine et al.

[11] Patent Number: 5,419,782
[45] Date of Patent: May 30, 1995

[54] ARRAY OF SOLAR CELLS HAVING AN OPTICALLY SELF-ALIGNING, OUTPUT-INCREASING, AMBIENT-PROTECTING COATING

[75] Inventors: Jules D. Levine; Milfred D. Hammerbacher, both of Dallas; Gregory B. Hotchkiss, Richardson, all of Tex.; Millard J. Jensen, deceased, late of Balch Springs, Tex., by Edna Jensen, heir

[73] Assignee: Texas Instruments Incorporated, Dallas, Tex.

[21] Appl. No.: 60,773

[22] Filed: May 11, 1993

[51] Int. Cl.⁶ .................. H01L 31/042; H01L 31/048; H01L 31/052; H01L 31/18
[52] U.S. Cl. .................................. 136/246; 136/250; 136/251; 437/2; 437/211; 437/219; 427/74
[58] Field of Search ........................ 136/246, 250, 251; 437/2, 211, 219; 427/74

[56] References Cited
U.S. PATENT DOCUMENTS

| | | | |
|---|---|---|---|
| 2,904,612 | 9/1959 | Regnier | 136/246 |
| 3,025,335 | 3/1962 | Ralph | 136/250 |
| 3,971,672 | 7/1976 | Lampkin | 136/246 |
| 4,116,718 | 9/1978 | Yerkes et al. | 136/246 |

*Primary Examiner*—Aaron Weisstuch
*Attorney, Agent, or Firm*—John D. Kaufmann; James C. Kesterson; Richard L. Donaldson

[57] ABSTRACT

A cover (14) for an array (12) of foil matrix-mounted (18), spaced photovoltaic members (16) protects the array (12) from the environment and increases its efficiency. Upper portions (31) of the members (16) extend above the free reflective surface (20T) of the foil matrix (18). The cover (14) includes an environment-excluding coating (60) which is emplaced on the array (12) to conform to the upper portions (31). The coating is configured as cusps (68) which overlie the free surface (20T) of the matrix (18) centrally between adjacent members (16). The nadirs (72) of the cusps (68) are closely spaced from the free surface (20T). Accordingly, each member (16) effectively supports a conformal lens (70) which directs thereat much of the otherwise "wasted" light that would fall on the free foil surface (20T) between adjacent members (16) and would not fall on the members (16).

34 Claims, 5 Drawing Sheets

ARRAY OF SOLAR CELLS HAVING AN OPTICALLY SELF-ALIGNING, OUTPUT-INCREASING, AMBIENT-PROTECTING COATING

BACKGROUND OF THE INVENTION

The present invention relates to a protective cover for a solar array or an array of solar cells, and, more particularly, to an optically self-aligning, output-increasing, ambient-protecting cover for an array of solar cells.

Various types of solar arrays for converting radiant energy, such as sunlight, into electricity are known. One type of array which is of particular current interest comprises a plurality of spaced members, typically spherical cells, supported by a flexible conductive sandwich which includes first and second foils separated by an insulative lamina. Each sphere is a semiconductor, for example silicon having a P-type interior and an N-type exterior or skin.

The spheres are loaded onto a foil matrix to form a cell sandwich. The foil matrix comprises the first foil, which is a thin, flexible metallic foil, typically aluminum, with a plurality of spaced cell-retaining apertures formed through the foil, for example by an emboss-then-etch or stamping process. The apertures typically define a regular geometrical pattern. Preferably, the pattern is a hexagon which permits maximum packing of the apertures (and, hence, of the spheres or cells) in the array. Loading the spheres involves placing an excess thereof onto a top surface of the matrix and, by the use of negative pressure and mechanical doctoring techniques, effecting the presence of one sphere in each aperture. Thereafter, heat and pressure are applied to the cell sandwich to move the spheres partially into and through the apertures. This movement effects the reaction of the aluminum foil with the very thin native silicon oxide layer on the spheres to locally remove the silicon oxide so that the abutting aluminum mechanically bonds directly to, and forms an electrical contact with, the N-type exterior of the spheres.

The affixing of the spheres to the foil matrix results in an upper light-gathering portion of each sphere protruding above a top surface of the first foil and a lower portion of each sphere protruding below a lower surface of the first foil. The lower portion of the each sphere is subjected to selective etching which removes the N-type exterior therefrom below the lower surface of the first foil to thereby expose the P-type interior of each sphere below such lower foil surface.

The lower foil surface and the exposed P-type lower sphere portions are then coated with a flexible, electrically insulative lamina, typically a polyimide, following which the second foil, preferably a flexible aluminum or other metallic foil, is electrically connected to the P-type interiors of the spheres. This latter electrical connection may be effected by selectively removing a portion of the polyimide to permit access to the P-type interiors of the spheres and then mechanically and electrically connecting the second foil to contacts engaging the P-type interiors and residing in holes formed in the lamina.

The foregoing and functionally similar solar arrays and techniques for producing them are disclosed in commonly assigned U.S. Pat. Nos. 5,192,400; 5,091,319; and 5,086,003; and in prior art cited therein.

The above-described solar array comprises a plurality of miniature solar cells—the spaced silicon spheres or other semiconductive members—connected in electrical parallel via the first and second foils. The foils, therefore, are connectable to a utilization device or circuit for electrical energization thereof when the array is exposed to radiant energy. The array is flexible and may be formed into various non-planar configurations, either free-standing or to conform to an irregular underlying surface.

While solar arrays constructed as set forth above are mechanically robust, protecting the arrays from the deleterious effects of the environment and ambient conditions is generally thought to be prudent. For example, water in the form of rain or other precipitation, in prolonged direct contact with the spheres or the foils can give rise to mechanical and/or electrical degradation of the array. Pollutants may also deleteriously affect the array, such as by attacking or preventing the functioning of the various elements thereof.

For the foregoing and other reasons, it is typical to cover, encapsulate or otherwise house solar arrays to protect them against ambient-caused degradation. Such protective measures have often taken the form of a rigid "picture frame" having a transparent cover which surrounds the solar array to isolate it from the ambient. The cover, of course, permits sunlight and other radiation to reach the cells or spheres where it is converted to electricity. Such picture frame covers are not flexible and limit the range of uses to which the flexible arrays may be put.

The upper portion of each sphere—an N-type silicon hemisphere—functions as a spherical lens. That is, this upper portion gathers light incident on the sphere and directs this light onto the sphere's P-N junction. These spherical lenses are able to direct to the junction only that light which is directly incident on the spheres or cells. Some of the light which is incident on the top surface of the first foil between the cells—that is, light which "misses" the spheres—is, in effect, "wasted" and is not effective to produce electricity, because it does not reach the P-N junction of the spheres, and is, instead, either absorbed by the top surface of the first foil or is back-reflected to the ambient.

An object of the present invention is the provision of a cover for solar arrays which encapsulates and protects the arrays from the ambient and which effects the direction onto the cells of a significant amount of the otherwise "wasted" light incident on the solar arrays. Another object of the present invention is the provision of a flexible cover having the foregoing characteristics which permits the forming of flexible solar arrays to assume non-planar configurations. Yet another object of the present invention is the provision of methods for producing the aforenoted cover.

SUMMARY OF THE INVENTION

With the above and other objects in view, the present invention relates to an improved optically self-aligning, output-enhancing, ambient-protective cover for an array of solar cells comprising a solar array. The array includes an apertured metallic foil supporting a plurality of spaced semiconductive members, such as spheres or cells typically in a regular geometric pattern, and preferably a hexagonal pattern. An upper light-gathering portion of each cell protrudes above a top surface of the foil. The top surface of the foil extends between the adjacent cells. The foil is connectable to a utilization device or circuit for conducting thereto electricity produced by the cells upon their exposure to radiant energy. Preferably, the cells are silicon and the foil is aluminum and is flexible.

The improved cover comprises an optically clear coating on the array. The coating adheres to the upper portions of the cells of the array and the top surface of the foil between the adjacent cells. The coating does not significantly absorb radiation in the solar spectrum, defined herein to mean radiation having wavelengths within the range 0.4 micron to 1.1 microns. The coating may result from spraying or otherwise depositing an appropriate material onto the array in liquid or other uncured form and then drying or curing the material. Dip coating and curtain coating procedures may also be employed in preferred embodiments, as set forth in more detail below. The coating may comprise a plurality of thin layers serially deposited on the array, although the coating may alternatively comprise a single layer.

The material of the coating is selected so that it conformably adheres to the upper cell portions. The free surface of the coating substantially follows and is parallel to the curvature of the upper portions of the spherical cells except in those regions whereat the coating directly overlies the top foil surface more or less centrally between adjacent cells. In these regions the free surface of the coating abruptly changes angle and forms, or is configured as, a cusp. The nadir, or lowest point, of each cusp is closely spaced from and is proximate to the top foil surface. This proximity and an appropriate index of refraction relative to air of the coating coact so that the coating directs onto the upper cell portions a substantial amount of the light which would be, absent the cover, directed onto the top foil surface, thereby increasing the output of the array for a given quantum of incident light. Increases of about 10%–20% are achievable when the cusp nadir is proximate to the top foil surface. The light directed by the coating onto the upper cell portions would, absent the coating, be wasted light, that is, light which would fall on the foil and would not enter the cell to produce electricity.

The coating is preferably 2–10 mils thick taken along a line which is perpendicular to the upper cell portion. The height of the nadir of the cusp above the top foil surface—the thickness of the coating taken along a line which is perpendicular to the top foil surface and which passes through the nadir of the cusp—is preferably 4–20 mils.

Preferred materials for the coating are acrylics, polyurethanes, polyurethane acrylics, silicones, fluoropolymers, polycarbonates, and any other clear material which is capable of being formed or deposited as a coating having the attributes described herein. The coating may also be an adherent tape made of the foregoing materials or a film or sheet thereof which is heated or otherwise treated (as with a solvent) to soften or melt the material and then resolidified. Various glasses, such as silica gel, spin-on glass, and low temperature liquid-glass may also be used.

In addition to being capable of adherently conforming to the cells so that the cusps between the adjacent cells are present, the optically clear, non-solar-spectrum-absorbing coating is also preferably resistant to the deleterious effects of UV and high temperatures. The latter resistance may be achieved by using a material that is thermosetting. Also, it is desirable that the free surface of the coating not be "sticky" or otherwise attract and hold thereon particulate material from the ambient. Moreover, it is preferred that the coating is flexible so that the flexible foil and the array, may be selectively shaped into various non-planar configurations. The conformality of the coating to the upper cell portions and the formation of the cusps has been found to expeditiously result from the use of self-levelling liquids which are dried or cured to form the coating.

As viewed from above the array, the cusps produce a hexagonal (or other regular geometric configuration) pattern of lines surrounding the cells. These lines extend between adjacent upper cell portions. The apparent thinness of the lines is directly related to the proximity of the cusp nadirs to the top foil surface. This proximity is, in turn, directly related to the output-increasing ability of the cover. Specifically, thin lines indicate that the nadirs are relatively closer to the top foil surface. Thicker lines indicate that the nadirs are relatively farther from the top foil surface. The greater the distance of the nadirs from the top foil surface, the less otherwise "wasted" light is directed to the cells, and the cover effects a lower increase in the output of the array than when the nadirs are closer to the top foil surface.

Because the cover is produced by depositing or forming the coating "in place" or in situ, the cover is optically self-aligning. That is, the portions of the coating conforming to the upper cell portions effectively act as spherical lenses which are precisely aligned with and in intimate contact with the upper cell portions which themselves act as spherical lenses. If the cover was preformed and subsequently placed on the array, such accurate optical alignment of the lenses of the cover and the lenses of the cells would be substantially more difficult to achieve over the entire array.

As noted, the present invention also contemplates methods of producing the above-described cover. The quality—thick or thin—of the lines of the pattern produced by the cusps may be detected as the coating is being formed. Such detection can be used to adjust the parameters of the coating-deposition or coating-forming process to ensure that the cusp nadirs are sufficiently close to the top foil surface. Where the coating comprises plural thin layers, such detection may be used to adjust the parameters of subsequent layer-forming steps in order to correct or ameliorate the effects of prior improper layers. Such detection may also be used following deposition or formation of the coating to indicate the output-increasing "quality" of the cover on a "go/no-go" basis.

DETAILED DESCRIPTION

Figure 1:
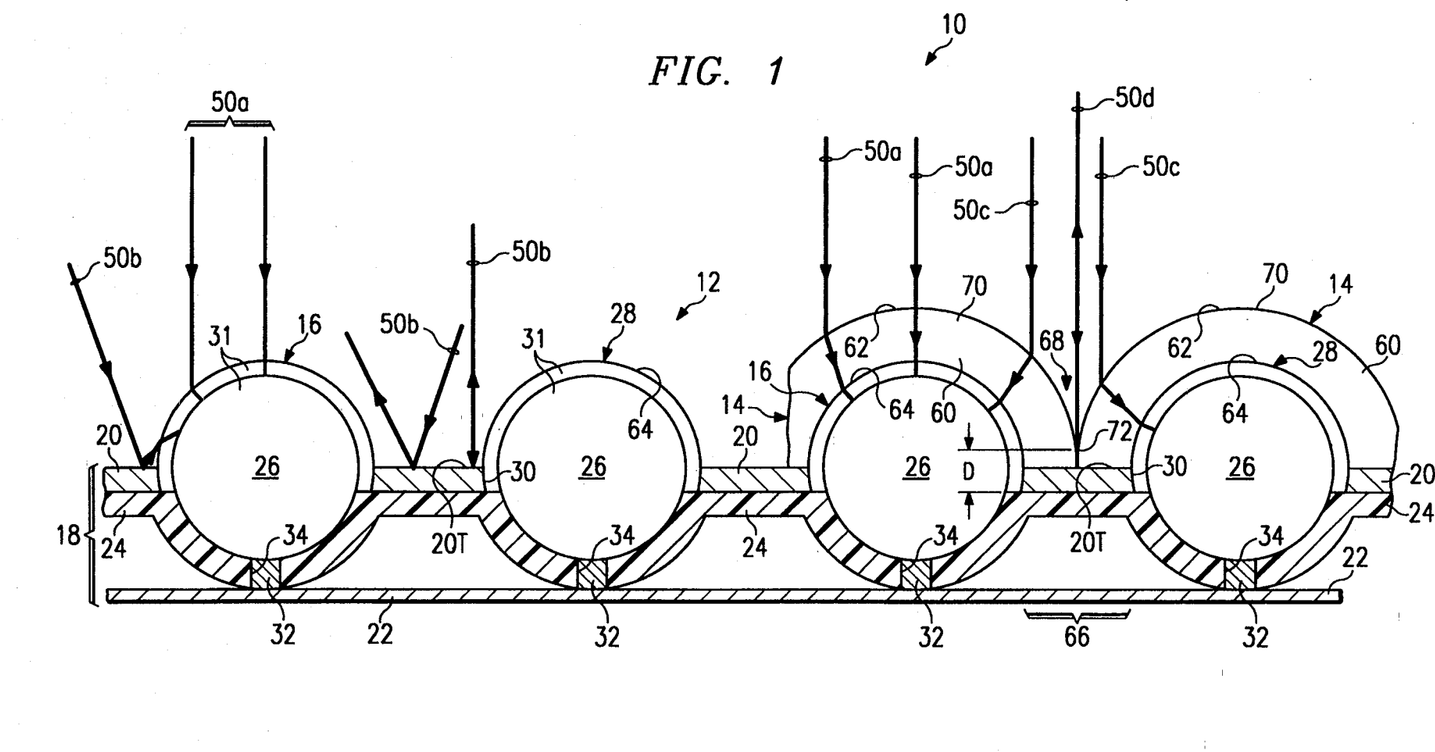
FIG. 1 is a side elevation of a fragment of a solar array taken generally along line 1—1 in FIG. 2, on a part of which there has been produced a cover according to the principles of the present invention.

Referring to FIG. 1 there is shown a side, sectioned view of a fragment 10 of a solar array 12. A right-hand portion of the solar array 12 is protected by a cover 14 according to the present invention, while a left-hand portion is not so protected.

The array 12 may include a plurality of spaced semiconductive members 16, which are preferably spheres typically constituted of silicon, affixed to a conductive sandwich 18. The conductive sandwich 18 may include a first or upper metallic foil 20 and a lower or second metallic foil 22 separated by an intervening insulative layer 24. Both foils 20 and 22 may be flexible and may be fabricated from aluminum. The layer 24 may also be flexible and may be a polyimide.

The spheres 16 include an interior portion 26 of one conductivity type, e.g., P-type, and an outer portion 28 of the opposite conductivity type, e.g., N-type. The spheres 16 are mounted to the first foil 20 by locating them in apertures 30 formed therein, with the walls of the apertures 30 being bonded and electrically connected to the N-type outer portions 28. An upper portion 31 of each sphere 16 thereby protrudes above the top surface 20T of the first foil 20. The second foil 22 is mechanically and electrically connected to the interior portion 26 of each sphere 16. To that end some of the outer portion 28 of each sphere 16 below the first foil 20 may be removed, the resulting exposed interior portion 26 of each sphere 16 and the lower surface of the first foil 20 being covered with the insulative layer 24. The second foil 22 electrically contacts the interior portions 26 via metallic contacts 32 which engage the interior portions 26 of the spheres 16 and are positioned in holes 34 formed through the insulative layer 24.

When light 50 is incident on the array 12, some of it 50a, as shown at the left of FIG. 1, is directly incident on the upper portions 31 of the spheres 16 and some of it 50b is directly incident on the top surface 20T of the first foil 20 between the adjacent spheres 16. Since a substantial amount of the light 50b incident on the top foil surface 20T is absorbed by the surface 20T or is rejected back away from the foil 20, little, if any, this light 50b, is incident on the spheres 16. The upper portions 31 of the spheres 16, comprising the N-type silicon 28, function as spherical lenses to gather and direct the light 50a incident thereon onto the P-N junctions 26–28 of the spheres 16. Light incident on this junction 26–28 produces electricity which Bows in the foils 20 and 22 for consumption by a utilization device or circuit.

Various elements and portions of the array 12 may be damaged or otherwise adversely affected by the environment. Rain, other precipitation, particulate matter, pollutants and other contents of the ambient can corrode, etch, render opaque, and otherwise damage the array 12. In view of this, the prior art typically resorts to enclosing the array 12 in a picture frame-like structure with glass or other optically clear material overlying the upper sphere portions for protecting the array 12 against environmental damage.

The cover 14 according to the present invention both protects the array against such environmental damage and increases the output of the array 10 per unit quantum of incident light. The cover 14 is also flexible, permitting the array 12 to be formed into various non-linear or non-planar configurations.

Continuing to refer to FIG. 1, a majority of the light collected by the upper sphere portions 31 is the light 50a directly incident thereon. Some of the light 50b directly incident on the top foil surface 20T will, depending on its angle of incidence and proximity to a sphere 16, be collected by the spherical lens 31 thereof and directed to the P-N junctions 26–28, as shown to the left of the leftwardmost sphere 16 in FIG. 1. Most of the light 50b incident directly on the top foil surface 20T is either reflected away therefrom along its incident path or is rejected away along a different path without striking a sphere 16, as shown immediately to the right of the leftwardmost sphere 16 in FIG. 1. In effect, much of the light 50b is "wasted," that is, it is not effective in the production of electricity by the spheres or cells 16.

The cover 14 shown at the right half of FIG. 1, directs much of this otherwise "wasted" light 50b onto the cells 16 and protects the array against the deleterious effects of the environment. The cover 14 is an optically clear coating 60 which absorbs little if any of radiation in the solar spectrum, defined herein to mean radiation having a wavelength within the approximate range of 0.4–1.1 micron. Radiation within this wavelength range is particularly effective in producing electricity at the P-N junction 26–28. Preferably, the coating 60 also resists the deleterious effects—such as embrittlement, cracking, warping or other deformation, loss of flexibility and clouding—of UV and high temperatures. The coating 60 conformably adheres to the upper sphere portions 31 and adheres to the top foil surface 20T to prevent deleterious components of the ambient from contacting and adversely affecting the solar array 12.

Figure 2:
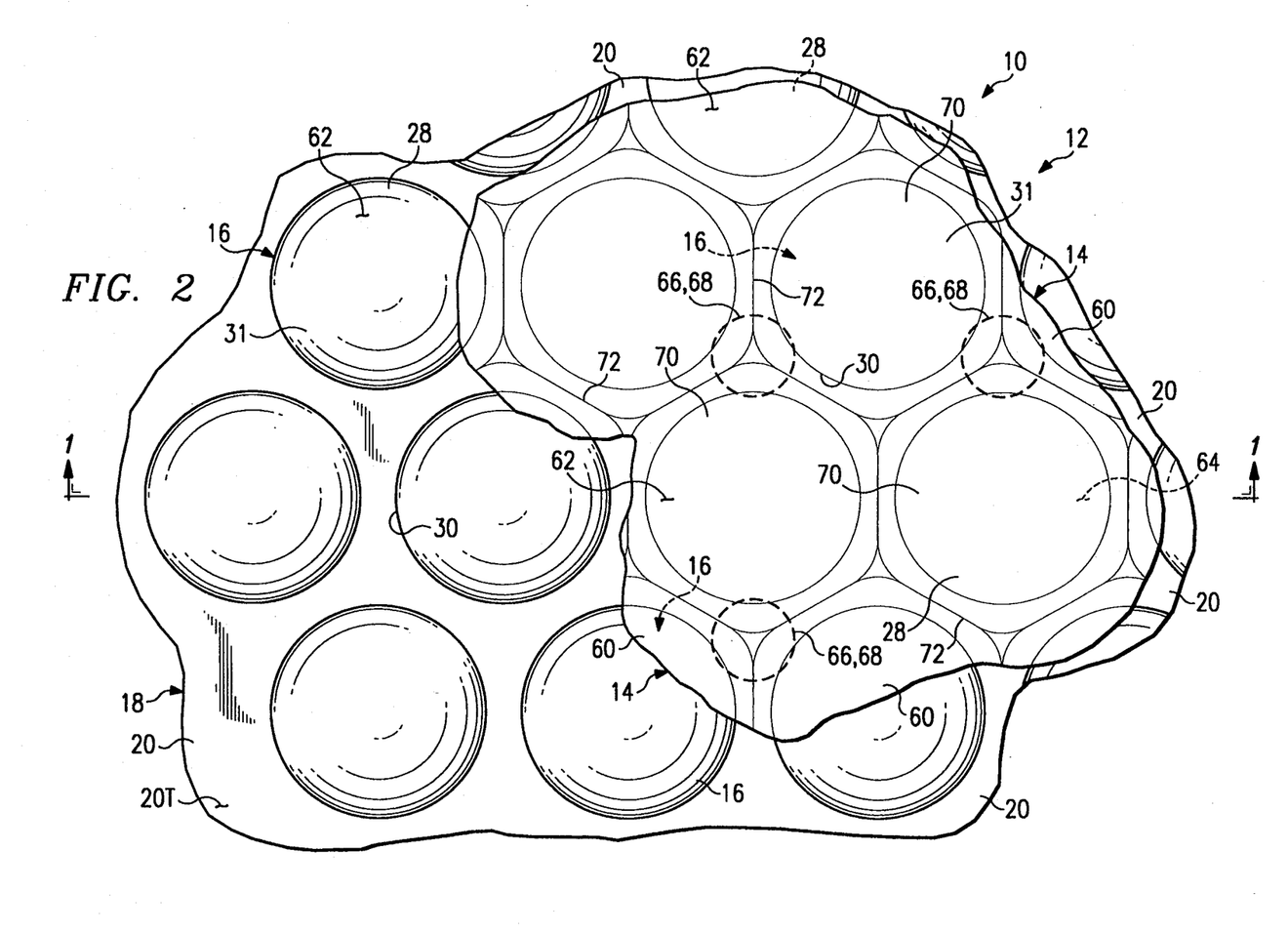
FIG. 2 is a plan view of the solar array fragment depicted in FIG. 1.
Figure 5:
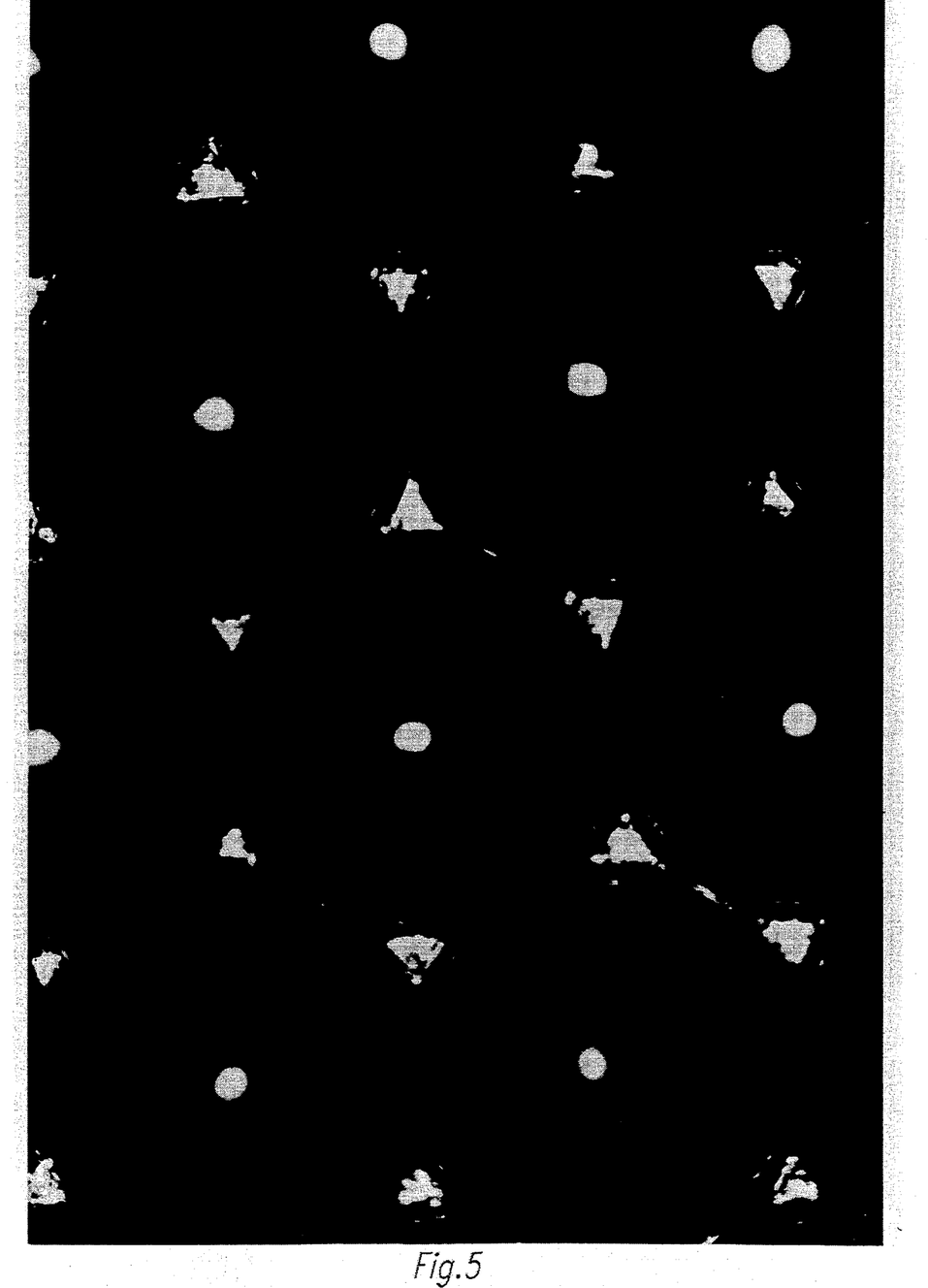
FIG. 5 is an enlarged photographic negative similar to FIG. 2 and showing a plan view of a solar array having thereon a cover according to the present invention.
Figure 6:
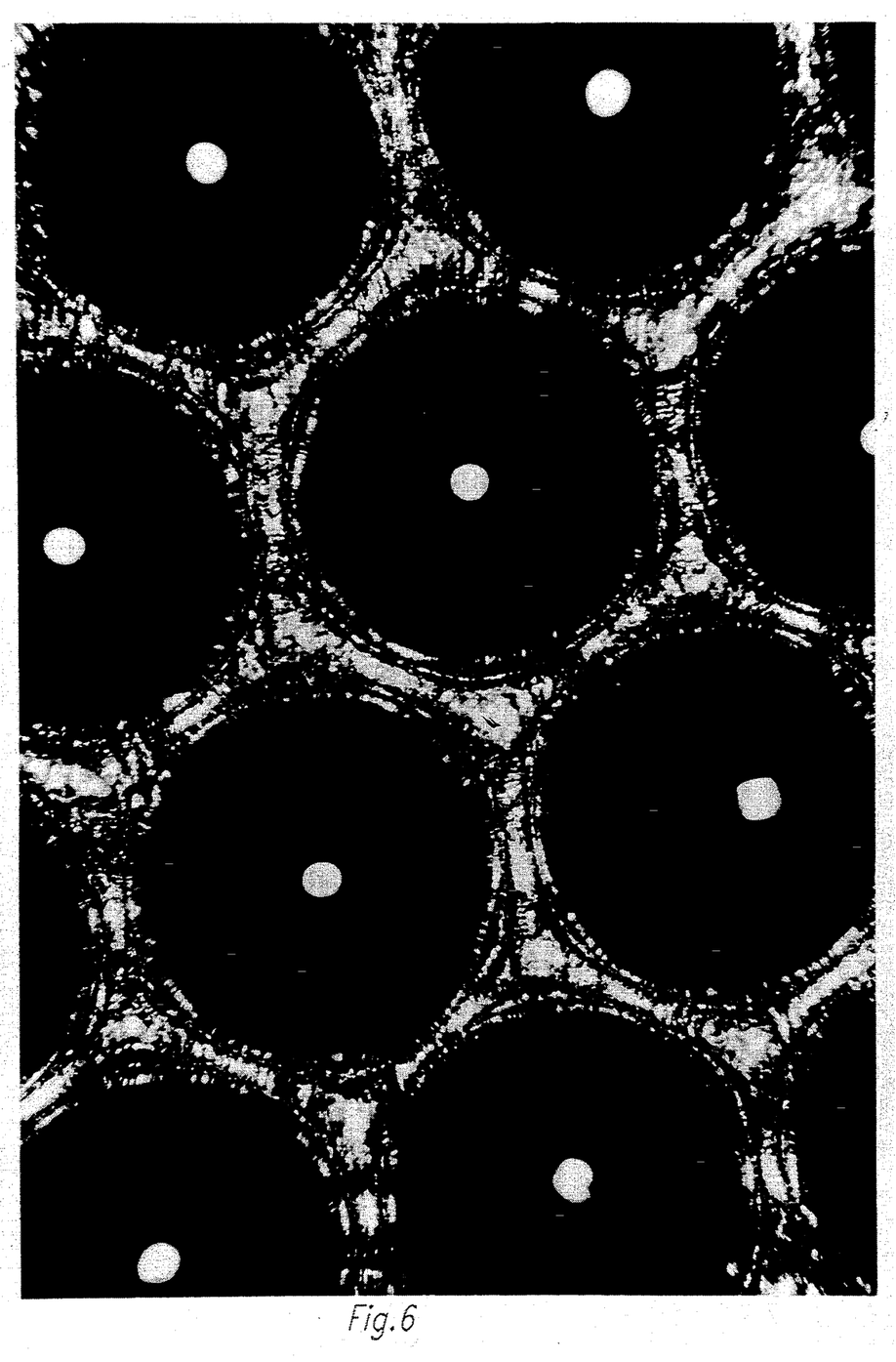
FIG. 6 is an enlarged photographic negative taken from above an solar array having thereon a cover similar to that depicted in FIGS. 3 and 4.

Specifically, the free surface 62 of the coating 60 substantially follows and is parallel to the free surface or curvature 64 of the upper sphere portions 31 except in regions 66 of the coating 60 which directly overlie the top foil surface 20T generally centrally between adjacent cells 16. In each of these regions 66 the free surface 62 forms a cusp 68, when the coating is viewed in section, as in FIG. 1. In actuality, from above as seen in FIGS. 2, 5, and 6, the cusps 68 appear as triangles which surround hexagonal-appearing spheres or cells 16 and, as shown in FIGS. 2 and 5, a plurality of hexagonal cusp or nadir patterns 68 or 72 is overlaid on the pattern of spheres 16. In effect each spherical lens 28 has adhered thereto a concentric spherical lens 70 delineated by the hexagonal cusp pattern and comprising conformal portions of the coating 60. See FIG. 5.

Returning to FIG. 1, the nadir 72 of each cusp 68 is closely spaced to the top foil surface 20T. The distance D between the nadirs 72 and such surface 20T and the index of refraction of the coating 60 relative to air are selected so that a substantial amount of the light 50b directed at the top foil surface 20T, rather than onto the spheres 16, is collected by the spherical lenses 70 of the coating 60 and directed through the spherical lens 28 portions of the spheres 16 onto the P-N junctions 26–28. This function of the cover 14 is illustrated at the right side of FIG. 1, whereat much of the otherwise "wasted" light 50c, which would otherwise fall on the top foil surface 20T—as does the light 50b at the left side of FIG. 1— is ultimately directed by the spherical lenses 70 onto the P-N junction 26–28. Only a small amount of the light 50d falling on, and immediately to either side of the nadirs 72 of the cusps 68 is not directed onto the P-N junctions 26–28.

Ideally, the lenses 70 would direct all light 50c and 50d, except that light 50d falling on the nadir 72, onto the P-N junctions 26–28, but this condition obtains only as the distance D approaches zero. In reality, D has a non-zero value, because the coating 60 is preferably continuous and integral and as such, D cannot be zero. If D is zero, the coating provides no protection against the components of the ambient at the nadirs 72. Thus, D is non-zero, but is sufficiently small so that it coacts with the refractive index of the coating 60 to collect and direct onto the cells 16 much of the light 50c. As shown in FIG. 5, the lines comprising the hexagonal pattern of nadirs 72 and cusps 68 as viewed from above the array 12 appear sharply defined and thin when the distance D is small. With the refractive index of the coating 60 and the distance D optimized as will easily be achieved by those skilled in the art, the output of the array 12 is increased by about 10%-20% per quantum of light 50a, 50c, 50d incident thereon, while the conformal, adherent cover 14 simultaneously affords the desired protection of the array 14 against the ambient.

In preferred embodiments, the thickness of the coating 60 is within the approximate range of 2-10 mils, taken along lines generally perpendicular to the upper sphere portions 31, and D has an approximate range of 4-20 mils taken along a line perpendicular to the top foil surface 20T and passing through a nadir 72 of a cusp 68. The spacing between the center of adjacent cells 16 is typically 33 mils, and the distance between the free surfaces 64 of adjacent cells taken along the top foil surface 20T is typically 3 mils. For these dimensions, the following table correlates the thickness of the coating 60 directly overlying the upper cell portions 31 with the resulting theoretical distance D:

| Coating 60 Thickness (mils) | D (mils) |
| --- | --- |
| 1.5 | 0 |
| 2 | 4.09 |
| 3 | 7.19 |
| 5 | 11.3 |
| 10 | 18.78 |

The appearance of the lines 72 as viewed in FIGS. 2 and 5, can be used to check the optical "quality" of the spherical lenses 70, given the dimensions of the array 12. As seen in FIG. 5, when D is minimized for a coating 60 of reasonable thickness and for specified sizes and spacings—center-to-center and peripheral—between the cells 16, the lines 72 are sharply defined and thin.

The coating 60 may constitute any optically clear, non-solar-spectrum-absorbing material which is capable of being conformally and adherently applied to the array 12 to produce the cover 60 having the aforenoted protective and light-gathering properties. When the coating 60 is applied in liquid or uncured form by spraying, dipping, or spray coating, it may be applied in one deposition step or as a plurality of layers or laminae, with each layer being dried or cured, as necessary. When thus applied, the material of the coating 60 is expediently one which is self-levelling, that is, the liquid or uncured coating material conforms to and its free surface 62 mimics the curvature of the upper cell portions 31 and the cusps 68 are formed. Preferred liquid or uncured materials include acrylics, polyurethanes, polyurethane acrylics, silicones, fluoropolymers, polycarbonates, other clear plastics and polymers, and glasses, such as silica gel, spin-on glass and low temperature glass. Adherent non-glass tapes may also be used to form the coating 60, as may films or sheets thereof. The use of tapes, films, or sheets may be accompanied by the use of heat, a solvent, or the like to melt or soften them, followed by their resolidification in the conformal, cusp-including configuration described above and shown in FIGS. 1, and 5.

As noted, the coating 60 material may be thermosetting. Preferably, the material does not attract particulate and other components of the ambient and does not hold or retain—and preferable sheds—such ambient components which fall on its free surface 62. Lastly, where the array 12 is flexible, the material of the coating 60 should also be flexible if the array 12 will be shaped into a non-planar configuration.

Figure 3:
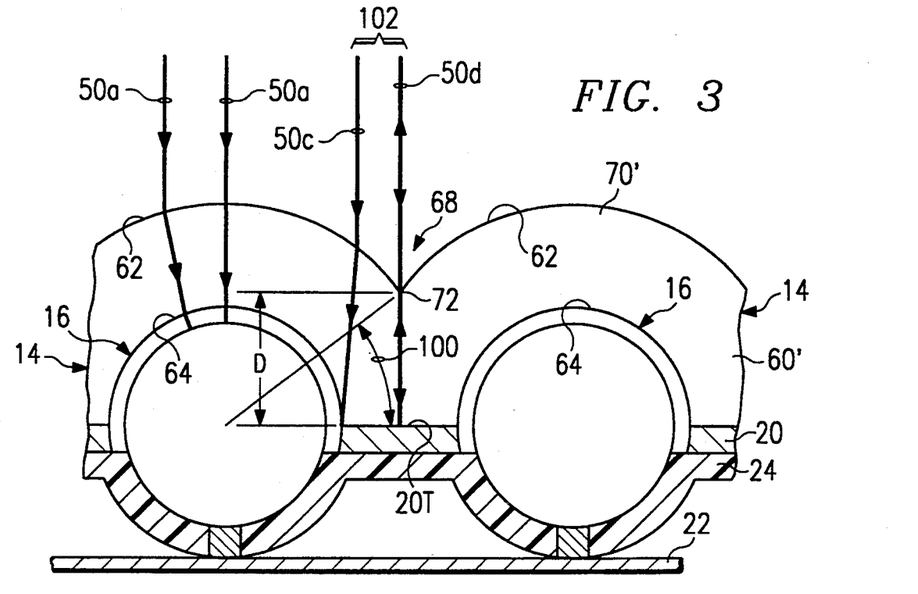
FIGS. 3 and 4 are side elevations similar to FIG. 1 wherein covers which are not produced according to the present invention are shown for purposes of detailing the shortcomings thereof.
Figure 4:
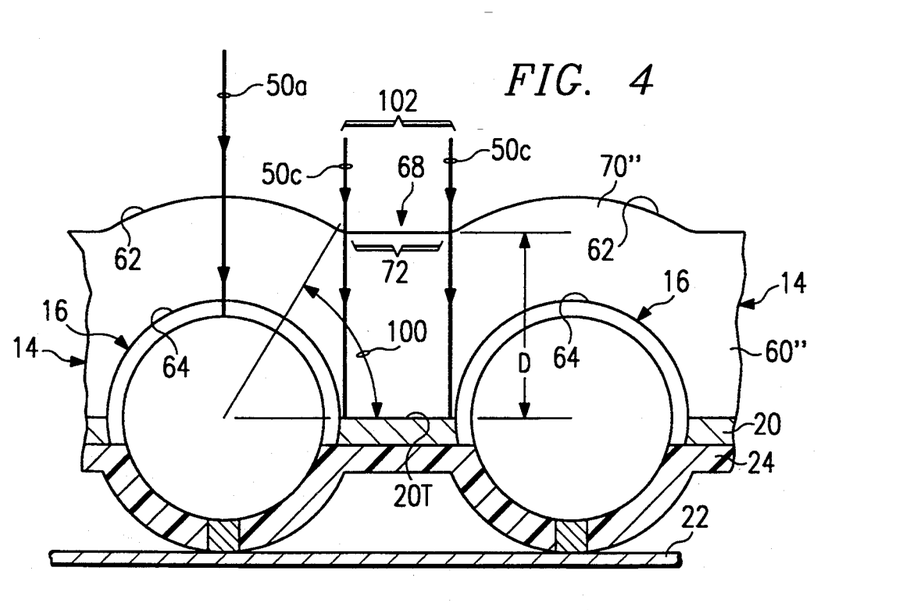

In FIGS. 3 and 4, the coating 60' is too thick in view of the size and spacing of the cells 16. This excessive thickness manifests itself in FIG. 3 by the excessive magnitude of D, ie., the cusps 68 are not as "severe" a those of FIGS. 1 and 2 and the cusp nadirs 68 are too far from the top foil surface 20T for the spherical lenses 70 to achieve the desired 10%-20% increase in the electrical output of the array 12. In effect, the spherical lenses 70 are "incomplete," sectors 100 of the upper cell portions 31 not being overlain thereby. As a consequence, most of the light 50c and 50d incident on the array 12 within regions 102 does not reach the cells 16. In FIG. 4, the cusps 68 of the coating 60" are essentially non-existent, as are the spherical lenses 70. The lines 72 in FIGS. 3 and 4 as viewed from above are thick and/or have irregular, meandering or "fuzzy" edges. FIG. 5 shows how indistinct and thick are the lines 72 when the coating 60' or 60" does not meet the desiderata of the present invention, as compared to the coating 60 of FIGS. 1, 2 and 5. Obviously, the quality of the lines 72 in FIGS. 5 and 6 can be sensed to provide data for adjusting the parameters of the processes for depositing the coating 60. Moreover, the quality of lines may be used on a go/no-go basis to judge the quality of acceptable (FIG. 5) and unacceptable (FIG. 6) covers 14.

Those skilled in the art will appreciate that various changes and refinements of the foregoing embodiments may be made without departing from the scope and coverage of the following claims.

What we claim is:

1. An array of contoured solar cells having an optically self-aligning, efficiency enhancing ambient-protective cover, the array comprising a metallic foil supporting a plurality of spaced apart, contoured semiconductive cells so that an upper light-gathering portion of each said contoured cell protrudes above the top surface of the foil with said top foil surface extending between adjacent, spaced apart, contoured upper cell portions, wherein the cover comprises:

an optically clear, non-solar-spectrum-absorbing, ambient-protective coating conformably positioned adjacent to the contoured upper cell portions and the foil surface, the free surface of the coating substantially following and being parallel to the curvature of the cells, except in regions whereat the coating directly overlies the top foil surface generally centrally between adjacent cells and the free surface abruptly changes angle and forms a cusp; the proximity of the nadir of each cusp to the top foil surface and the index of refraction of the coating relative to air coacting so that a substantial amount of light which would otherwise be incident on the top foil surface and would not fall on the contoured upper cell portions is directed by the coating onto the contoured upper cell portions, thereby increasing the output of the array per quantum of incident light.

2. The array as in claim 1, wherein:
the coating is about 2-10 mils thick taken along a line which is generally perpendicular to the contoured upper portions.

3. The array as in claim 2, wherein:
the coating is about 4-20 mils thick taken along a line perpendicular to the top foil surface and passing through the nadir of a cusp.

4. The array as in claim 1, wherein:
the coating is about 4-20 mils thick taken along a line perpendicular to the top foil surface and passing through the nadir of a cusp.

5. The array as in claim 1, wherein:
the output increase effected by the cover is related to the distance between the cups's nadir and top foil surface.

6. The array as in claim 5, wherein:
the output increase effected by the cover is within the range of about 10%-20%.

7. The array as in claim 1, wherein:
the coating comprises a material selected from the group consisting of acrylics, polyurethanes, polyurethane acrylics, silicones, fluoropolymers, polycarbonates, clear plastics, tapes, sheets, and films made from any of the foregoing, silica gel, spin-on glass, and low temperature liquid glass.

8. The array as in claim 7, wherein:
the cells are silicon spheres and the foil is aluminum.

9. The array as in claim 7, wherein:
the coating comprises a material selected from the group consisting of acrylics, polyurethanes, polyurethane acrylics, silicones, fluoropolymers, polycarbonates and clear plastics and tapes, sheets, and films made from any of the foregoing.

10. The array as in claim 9, wherein:
the cells are silicon spheres and the foil is aluminum.

11. The array as in claim 1, wherein:
the coating is UV-resistant.

12. The array as in claim 1, wherein:
the coating is high temperature-resistant.

13. The array as in claim 12, wherein:
the coating is thermosetting.

14. The array as in claim 1, wherein:
the free surface of the coating is resistant to the attraction thereonto and to the adherence thereon of particulate material from the ambient.

15. The array as in claim 1, wherein:
the foil, and consequently the array, is flexible, and the cover is flexible, whereby the array with the cover thereon may be selectively shaped into various non-planar configurations.

16. The array as in claim 1, wherein:
the coating comprises a material which is deposited on the array as a self-levelling liquid.

17. The array as in claim 1, wherein:
as viewed from above the cover, the cusps produce a regular geometric pattern of lines extending between adjacent contoured upper cell portions, the thinness of the lines being directly related to the proximity of the nadirs of the cusps to the top foil surface, which proximity is, in turn, directly related to the output-increasing ability of the cover.

18. The array as in claim 17, wherein:
thicker lines are indicative of cusp nadirs which are not proximate the top foil surface and which thereby result in less light being directed by the coating onto the contoured upper cell portions.

19. The array as in claim 1, wherein:
the coating comprises a material deposited on the array as plural thin layers in liquid or uncured form, each layer being permitted to dry or cure before deposition of subsequent layers.

20. The array as in claim 19, wherein:
the material is deposited by spraying.

21. The array as in claim 19, wherein:
the liquid or uncured material is self-levelling.

22. The array as in claim 19, wherein:
as viewed from above each thin layer, the cusps produce a regular Geometric pattern of lines extending between adjacent contoured upper cell portions, the thinness of the lines being directly related to the proximity of the nadirs of the cusps to the top foil surface, which proximity is, in turn, directly related to the output-increasing ability of the cover.

23. The array as in claim 22, wherein:
thicker lines are indicative of cusp nadirs which are not proximate the top foil surface, thereby resulting in less light being directable by the coating onto the contoured upper cell portions, the character of the lines thereby serving as a quality measure of each thin layer and of the coating.

24. A method of producing an array of contoured solar cells having an optically self-aligning, efficiency-enhancing ambient-protective cover, the array comprising a metallic foil supporting a plurality of spaced apart contoured semiconductive cells so that an upper light-gathering portion of each contoured cell protrudes above a top surface of the foil with the top foil surface extending between adjacent, spaced apart contoured upper cell portions, wherein the method comprises:
depositing on the array an optically clear, non-solar spectrum-absorbing, ambient-protective coating of a material which is conformably positioned adjacent to the contoured upper cell portions and to the top foil surface so that the free surface of the coating substantially follows and is parallel to the curvature of the cells, except in regions whereat the coating directly overlies the top foil surface generally centrally between adjacent cells and the free surface abruptly changes angle and forms a cusp; the proximity of the nadir of each cusp to the top foil surface and the index of refraction of the coating relative to air coacting so that a substantial amount of light which would otherwise be incident on the top foil surface and not fall on the contoured upper cell portions, is directed by the coating onto the contoured upper cell portions, thereby increasing the output of the array per quantum of incident light.

25. A method as in claim 24, wherein:
the depositing step is effected by serially depositing plural thin layers of the material in liquid or uncured form onto the array and drying or curing each layer before a subsequent layer is deposited.

26. A method as in claim 25, wherein:
the liquid or uncured material is self-levelling.

27. A method as in claim 26, wherein:
as observed from above each thin layer and the coating, the cusps produce a regular geometric pattern of lines extending between adjacent contoured upper cell portions, the thinness of the lines being directly related to the proximity of the nadirs of the cusps to the top foil surface, which proximity is, in turn, directly related to the output-increasing ability of the cover.

28. A method as in claim 27, which further comprises: adjusting the parameters of the depositing steps in response to the thinness of the lines.

29. A method as in claim 24, wherein:
the coating comprises a material selected from the group consisting of acrylics, polyurethanes, polyurethane acrylics, silicones, fluoropolymers, polycarbonates, clear plastics, tapes, sheets, and films made from any of the foregoing, silica gel, spin-on glass, and low temperature liquid glass.

30. A method as in claim 29, wherein:
the cells are silicon spheres and the foil is aluminum.

31. A method as in claim 24, wherein: as observed from above the coating, the cusps produce a regular geometric pattern of lines extending between adjacent said contoured upper cell portions, the thinness of the lines being directly related to the proximity of the nadirs of the cusps to the top foil surface, which proximity is, in turn, directly related to the output-increasing ability of the cover, and which further comprises
adjusting the parameters of the depositing step in response to the thinness of the lines as the depositing step is effected.

32. A method as in claim 24, wherein:
the coating is about 2–10 mils thick taken along a line which is generally perpendicular to the contoured upper cell portions.

33. A method as in claim 32, wherein:
the coating is about 4–20 mils thick taken along a line perpendicular to the top foil surface and passing through the nadir of a cusp.

34. A method as in claim 24, wherein:
the coating is about 4–20 mils thick taken along a line perpendicular to the top foil surface and passing through the nadir of a cusp.

* * * * *